United States Patent [19]

Manako et al.

[11] Patent Number: 5,328,892

[45] Date of Patent: Jul. 12, 1994

[54] OXIDE SUPERCONDUCTOR COMPOSITION AND A PROCESS FOR THE PRODUCTION THEREOF

[75] Inventors: Takashi Manako; Yuichi Shimakawa; Yoshimi Kubo, all of Tokyo, Japan

[73] Assignee: NEC Corporation, Tokyo, Japan

[21] Appl. No.: 413,237

[22] Filed: Sep. 27, 1989

[30] Foreign Application Priority Data

Sep. 28, 1988 [JP] Japan .................................. 63-245064
Nov. 7, 1988 [JP] Japan .................................. 63-281909

[51] Int. Cl.$^5$ .................... C01F 11/02; C01G 3/02; H01L 39/12
[52] U.S. Cl. .................... 505/120; 252/518; 252/521; 505/775; 505/779; 505/783; 505/492; 423/593
[58] Field of Search .................... 505/1, 783, 775, 779; 252/518, 521

[56] References Cited

U.S. PATENT DOCUMENTS 4,870,052 9/1989 Engler et al. ........................... 505/1
4,880,773 11/1989 Itozaki et al. ........................ 423/635
4,962,083 10/1990 Hermann et al. ....................... 505/1

FOREIGN PATENT DOCUMENTS 361963 4/1990 European Pat. Off. .
8810009 12/1988 World Int. Prop. O. .

OTHER PUBLICATIONS

Inoue "Superconductivity in a Tl-Sr-Y-Cu-O System" *Jap. Int. Appl. Phys.*, vol. 28 (8) Aug. 1989 pp. L1375-L1377.
Vijayaraghaven "Investigations of novel cuprates of TlCa$_{1-x}$Ln$_x$Sr$_2$C$_2$O$_7$" *Superconductor: Science & Tech.* vol. 2(3) Sep. 1989 pp. 195-201.
Saito "High-T$_c$ Superconducting properties in (Y$_1$Tl) Ba$_2$Cu$_3$O$_7$..." *Physica 148B* 1987 pp. 336-338.
Nagashima "Improving Superconducting Characteristics of Tl-Sr-Ca-Cu-O" *Jap. Inl. Appl. Phys.* vol. 20(6) Jun. 1989 pp L930-L933.
Bhattacharya "High-Temperature super ... in the Y$_{l-x}$-A$_x$Ba$_2$Cu$_3$O$_7$..." *Physica C 152* Jun. 1, 1988 pp. 283-285.
Sheng "Superconductivity above 77 k in the R-Tl-Sr-Ca-Cu-O..." *Phys. Rev. B vol. 39* (4) Feb. 1, 1989 pp. 2918-2920.
Kaneko "On the coprecipitation method for the preparation ..." *Jap. Jnl. Appl. Phys. vol. 26*(5) May 1987 pp. L734-L735.
Murphy "New superconducting Cuprate Perovskites" *Phys. Rev. Lett.* vol. 58 (18) May 1987.
U. V. Varadaraju et al., "Effect of Chemical Substitution on the High-T$_c$ Behavior of YBa$_2$Cu$_3$O$_7$", Physica 148B, 1987, pp. 417-418 (no month provided).
S. Tsurumi et al., "High-T$_c$ Superconductivities of (Y$_{1-x}$Yb$_x$)$_2$Ba$_4$Cu$_6$O$_{14+y}$(0<y<2.5)", Japanese Journal of Applied Physics, vol. 26, No. 5, May 1987, pp. L704-L705.
A. Oota et al., "Electrical, Magnetic and Superconducting Properties of High-T$_c$ Superconductor (Y,Sc)-(Ba,Sr)-Cu Oxide", Japanese Journal of Applied Physics, vol. 26, No. 8, Aug. 1987, pp. L1356-L1358.
S. Kondoh et al., "Superconductivity In Tl-Ba-Cu-O System", Solid State Communications, vol. 65, No. 11, Mar. 1988, pp. 1329-1331.

(List continued on next page.)

*Primary Examiner*—Paul Lieberman
*Assistant Examiner*—John Boyd
*Attorney, Agent, or Firm*—Burns, Doane, Swecker & Mathis

[57] ABSTRACT

An oxide superconducting material having a composition represented by a formula $$TlSr_2(Sr_{n-x}Y_x)Cu_{n+1}O_{5+2n}$$

wherein n=1 or 2 and 0.1≦x≦n is provided. This material has a high critical current density Jc even by sintering at a relatively low temperature of 850°–880° C.

18 Claims, No Drawings

OTHER PUBLICATIONS

Z. Z. Sheng et al., "Superconductivity In The Rare-Earth-Free Tl–Ba–Cu–O System Above Liquid-Nitrogen Temperature", Letters To Nature, Mar. 1988.

Z. Z. Sheng et al., "Superconductivity At 90 K In The Tl–Ba–Cu–O System", Physical Review Letters, vol. 60, No. 10, Mar. 7, 1988, pp. 937–940.

M. Sera et al., "On The Structure Of High-$T_c$ Oxide System Tl–Ba–Cu–O", Solid State Communications, vol. 66, No. 7, May 1988, pp. 707–709.

C. C. Torardi et al., "Structures Of The Superconducting Oxides $Tl_2Ba_2CuO_6$ And $Bi_2Sr_2CuO_6$", Physical Review B, vol. 38, No. 1, Jul. 1, 1988, pp. 225–231.

R. Beyers et al., "Crystallography And Microstructure of Tl–Ca–Ba–Cu–O Superconducting Oxides", Applied Physics Letters, vol. 53, No. 5, Aug. 1, 1988, pp. 432–434.

R. Sugise et al., "The Formation Process of New High-$T_c$ Superconductors with Single-Layer Thallium-Oxide, $TlBa_2Ca_2Cu_3O_y$ and $TlBa_2Ca_3Cu_4O_y$", Japanese Journal of Applied Physics, vol. 27, No. 9, Sep. 1988, pp. L1709–L1711.

A. K. Ganguli et al., "Superconductivity In Bi–Ca–Y–Sr–Cu–O (2122) And Tl–Ca–Y–Ba–Cu–O (1122)", Mat. Res. Bull., vol. 24, No. 1, Jan. 1989, pp. 103–109.

T. Manako et al., "Superconductivity of $TlBa_{1+x}La_{1-x}CuO_5$ With 1201 Structure", Physica C 158, Apr. 1989, pp. 143–147.

S. Nakajima et al., "Over-Doping of $Tl_2Ba_2CuO_6$ Due to Charge Transfer $Tl^{3-t}-(Cu-O)^{p}$", Physica C 160, Jun 1989, pp. 458–460.

H. C. Ku et al., "The Occurrence of Superconductivity in the $TlBa_2CuO_{5-\delta}$-type (1021) System", Japanese Journal of Applied Physics, vol. 28, No. 6, Jun. 1989, pp. L923–L925.

J. B. Shi et al., "Superconductivity Enhancement in the (Tl,Pb) $(A,R)_2CuO_5$ System (A=Sr,Ba: R=La,Pr,Nd)", Physica C 162–164, Jul. 1989, pp. 721–722.

C. Martin et al., "A New 50 K Superconductor, $Tl_{1+x}Ba_{2-x-y}La_yCuO_{5-\delta}$, First Member of the Series $TlA_2Ca_{m-1}Cu_mO_{2m+3}$", Modern Physics Letters B, vol. 3, No. 15, Oct. 1989, pp. 1143–1148.

M. A. Subramanian, et al., "$TlBa_{1-2}La_{0.8}CuO_5$: A Superconductor Produced By Reduction, Rather Than Oxidation, Of The $CuO_2$ Planes", Physica C166, Mar. 1990, pp. 19–24.

OXIDE SUPERCONDUCTOR COMPOSITION AND A PROCESS FOR THE PRODUCTION THEREOF

BACKGROUND OF THE INVENTION

1. Field of the Invention

The present invention relates to an oxide superconducting material for use in various superconductivity application apparatus and superconducting devices.

2. Description of the Prior Art

Up to the present, metal or alloy superconducting materials, intermetallic compound superconducting materials, etc. have already been put into practical use as superconducting materials. The superconducting materials are used for production of coils for superconducting magnets, electronics devices such as a Josephson device, etc. and are expected to realize applications particularly to a Superconducting Quantum Interference Device (=SQUID) and a precision measurement technique, utilizing the merits of high sensitivity, high precision and low noise properties of a Josephson junction, and also to an electronic computer, taking advantage of high speed responsibility and low electric power consumption properties of the Josephson junction.

It is desired that a superconductivity transition temperature Tc of a superconducting material is as high as possible. Since an oxide superconductor of La—Ba—Cu—O system having a Tc around 30 K. was found, there are successively found oxide superconductors of Ba—Y—Cu—O system having a Tc around 90 K., Bi—Sr—Ca—Cu—O system having a Tc around 110 K., Tl—Ba—Ca—Cu—O system having a Tc around 120 K., etc. These findings of the materials having Tc far exceeding a liquid nitrogen temperature are further enhancing expectations for use as practical materials.

For applying a superconducting material to an electronics device, it is preferred that the maximum temperature in the entire process for production is as low as possible. It is also important that the critical current density Jc is as large as possible, from the viewpoint of wiring materials. In a Tl—Ba—Ca—Cu system superconductor having not lower than 100 K. superconductivity transition temperature, it is necessary to carry out firing at a temperature of 890°-910° C. for obtaining a higher Jc. Any firing at a lower temperature does not complete sintering and so causes a lower Jc.

SUMMARY OF THE INVENTION

An object of the present invention is therefore to present a superconductor which has an optimum firing temperature lower than that of the prior art superconductor and at the same time has a high Jc as obtained heretofore only at a higher firing temperature.

The present inventors have found through intensive and extensive researches that an oxide superconductor composition comprising a thallium (Tl). strontium (Sr), yttrium (Y) and copper (Cu) in a form of an oxide; a ratio of these elements being represented by a formula $$TlSr_2(Sr_{n-x}Y_x)Cu_{n+1}O_{5+2n} \quad (I)$$

wherein n=1 or 2 and x is in a range of $0.1 \leq x \leq n$, differently from the prior art composition particularly of a formula $$Tl_2Ba_2Ca_{n-1}Cu_nO_y \quad (II)$$

wherein n=1, 2 or 3, has a high Jc even by sintering at a relatively low temperature of 850°-880° C. and thus completed the present invention. The present inventors have found also that the properties of the sintered body can be further improved by wrapping the pressed molded body with a gold foil at sintering.

The composition of the present invention represented by the above formula (I) includes two cases, that is, a case wherein n=1 and a case wherein n=2, respectively corresponding to the following formulae:

$$TlSr_{3-x}Y_xCu_2O_7 \quad (IA)$$

wherein $0.1 \leq x \leq 1$, and $$TlSr_{4-x}Y_xCu_3O_9 \quad (IB)$$

wherein $0.1 \leq x \leq 2$. Unit cells of the layered perovskite-like crystal structures of these compositions of the formulae (IA) and (IB) may be shown respectively as follows:

$$TlO/SrO/CuO_2/Sr \text{ or } Y/CuO_2/SrO \quad (IX)$$

$$TlO/SrO/CuO_2/Sr \text{ or } Y/CuO_2/Sr \text{ or } Y/CuO_2/SrO \quad (IY)$$

from which it will be understood that the structures of these compositions are similar but different mainly in respect of the number of $CuO_2$ layers in the repeating cycle.

In effect, the present inventors have confirmed by experiments that the composition of the above formula (II) wherein n=2, that is, of the following formula:

$$Tl_2Ba_2CaCu_2O_y \quad (IIc)$$

has Jc of 100 A/cm² at 77 K. after sintering at 870° C. for one hour.

On the other hand, it has been found that the compositions according to the present invention, that is, of the formula (IA) wherein x=1, namely of a formula $$TlSr_2YCu_2O_7 \quad (Ia)$$

and of the formula (IB) wherein x=1, namely of a formula $$TlSr_3YCu_3O_9 \quad (Ib)$$

give structurally fine sintered body having Jc respectively of 800 A/cm² and 900 A/cm², under the sintering condition same as the above mentioned condition for the composition (IIc).

It has also been found that the sintered body obtained from the composition of the formula (Ia) shows sharp transition into superconducting state at 85 K., and after such transition, the entire volume is in the superconducting state; and that obtained from the composition of the formula (Ib) shows sharp transition into superconducting state at 100 K., and after such transition, about 80% of the entire volume is in the superconducting state.

DESCRIPTION OF THE PREFERRED EMBODIMENTS

The present invention will be explained below further in detail with respect to its some embodiments shown as working examples.

EXAMPLE 1

As for starting materials, thallium oxide ($Tl_2O_3$), strontium oxide (SrO), yttrium oxide ($Y_2O_3$) and cupric oxide (CuO), respectively of 99% or more purity were used. These materials were taken up and weighed to show each of the composition ratios as shown in the following Table 1, well mixed in a mortar and then pressed into a pressed body in a size of 5 mm×10 mm×1 mm. This pressed body was sintered at 850°–870° C. for 1–10 hours in an oxygen atmosphere.

Then measurements were made on the sintered bodies of the compositions shown in the Table 1 as to their resistivities, critical current densities, and superconductivity volume fractions in order to evaluate their superconductivity properties.

The resistivity was measured by using a dc four probe method. The electrical contacts were made by using gold electrodes sputtered on the sample surface and the copper lead wires plated with tin.

The critical current density also was measured by the dc four probe method. The current value at which 0.1 μV or more voltage was generated between the voltage leads was employed as Jc.

The superconductivity volume fraction was obtained by an ac magnetic susceptibility measurement, which was carried out by determining any change of inductance L of a coil wherein a sample was placed, and calculating on the basis of ΔL at 4.2 K. of lead of the same volume and the same shape as equal to 100.

The resistivity measurement was made within a temperature range of from a room temperature to a temperature showing zero resistivity and the magnetic susceptibility measurement was made within a temperature range of from a room temperature to 4.2 K.

In the Table 1, the critical temperature at which the resistivity becomes zero and the critical current density at 77 K. as measured on the compositions are shown along with the composition ratios.

TABLE 1

| Sample No. | Composition | Tc (K) | Jc (A/cm²) |
| --- | --- | --- | --- |
| 1 | $TlSr_{2.9}Y_{0.1}Cu_2O_7$ | 81 | 470 |
| 2 | $TlSr_{2.8}Y_{0.2}Cu_2O_7$ | 83 | 530 |
| 3 | $TlSr_{2.5}Y_{0.5}Cu_2O_7$ | 85 | 700 |
| 4 | $TlSr_{2.2}Y_{0.8}Cu_2O_7$ | 87 | 690 |
| 5 | $TlSr_{2.0}Y_{1.0}Cu_2O_7$ | 88 | 800 |

EXAMPLE 2

The procedures same as those described in the above Example 1 were repeated, excepting that the starting materials were mixed in the composition ratios as shown in the following Table 2, the sintering was made at 860°–880° C. and some of the samples were sintered after wrapped with gold foil.

The results are shown in the Table 2 along with the composition ratios.

TABLE 2

| Sample No. | Composition | Tc (K) | Jc (A/cm²) |
| --- | --- | --- | --- |
| 6 | $TlSr_{3.9}Y_{0.1}Cu_3O_9$ | 90 | 500 |
| 7 | $TlSr_{3.5}Y_{0.5}Cu_3O_9$ | 98 | 850 |
| 8 | $TlSr_{3.0}Y_{1.0}Cu_3O_9$ | 100 | 900 |
| 9 | $TlSr_{2.8}Y_{1.2}Cu_3O_9$ | 107 | 1000 |
| 10 | $TlSr_{2.0}Y_{2.0}Cu_3O_9$ | 110 | 1100 |

As shown in the above Examples 1 and 2, the compositions according to the present invention give large Jc even though they are sintered at a temperature lower than that of the prior art.

It was also found that in case the samples were wrapped with gold foil and sintered, the property values were improved for some percents.

It is to be noted however that if x was made less than 0.1, no superconductivity property was shown and so such x is not suitable for the purpose of the present invention, that if x was made larger than n, the volume fraction and therefore Jc was reduced, and that if the sintering was carried out at a temperature outside the range of 850°–880° C., no sufficient sintering could be reached or the volume fraction was reduced.

Thus the present invention provides a very useful superconducting material, in that the composition according to the present invention enables to reach high critical current density even by sintering at a lower temperature.

We claim:

1. An oxide superconductor composition consisting essentially of thallium (Tl), strontium (Sr), yttrium (Y) and copper (Cu) in a form of an oxide; a ratio of these elements being represented by a formula $$TlSr_2(Sr_{n-x}Y_x)Cu_{n+1}O_{5+2n} \qquad (I)$$

wherein n=1 or 2 and x is in a range of $0.1 \leq x \leq n$.

2. A process for the production of an oxide superconductor composition consisting essentially of thallium (Tl), strontium (Sr), yttrium (Y) and copper (Cu) in a form of an oxide; a ratio of these elements being represented by a formula $$TlSr_2(Sr_{n-x}Y_x)Cu_{n+1}O_{5+2n} \qquad (I)$$

wherein n=1 or 2 and x is in a range of $0.1 \leq x \leq n$:

in which process, thallium oxide ($Tl_2O_3$), strontium oxide (SrO), yttrium oxide ($Y_2O_3$) and cupric oxide (CuO) are mixed together in a ratio of giving the above formula, pressed and fired.

3. The oxide superconductor of claim 1, wherein the oxide superconductor has a critical temperature of at least about 81 K.

4. The oxide superconductor of claim 1, wherein the oxide superconductor has a critical current density at 77 K. of at least about 470 A/cm².

5. The oxide superconductor of claim 1, wherein the oxide superconductor has a critical temperature of at least about 100 K. and a critical current density at 77 K. of at least about 1000 A/cm².

6. The oxide superconductor of claim 1, wherein the oxide superconductor has a critical temperature of at least about 90 K. and a critical current density at 77 K. of at least about 500 A/cm².

7. The oxide superconductor of claim 1, wherein n=1 and $0.1 \leq x \leq 1.0$.

8. The oxide superconductor of claim 7, wherein the oxide superconductor comprises a sintered body having a critical temperature of about 85 K. and an entire volume of the sintered body of the oxide superconductor is in a superconducting state.

9. The oxide superconductor of claim 1, wherein n=2 and $0.1 \leq x \leq 2.0$.

10. The oxide superconductor of claim 9, wherein the oxide superconductor comprises a sintered body having a critical temperature of 100 K. and about 80% of an entire volume of the sintered body of the oxide superconductor is in a superconducting state.

11. The process of claim 2, wherein the oxide superconductor has a critical temperature of at least about 81 K.

12. The process of claim 2, wherein the oxide superconductor has a critical current density at 77 K. of at least about 470 A/cm$^2$.

13. The process of claim 2, wherein the oxide superconductor has a critical temperature of at least about 100 K. and a critical current density at 77 K. of at least about 1000 A/cm$^2$.

14. The process of claim 2, wherein the oxide superconductor has a critical temperature of at least about 90 K. and a critical current density at 77 K. of at least about 500 A/cm$^2$.

15. The process of claim 2, wherein n=1 and $0.1 \leq x \leq 1.0$.

16. The process of claim 15, wherein the oxide superconductor comprises a sintered body having a critical temperature of about 85 K. and an entire volume of the sintered body of the oxide superconductor is in a superconducting state.

17. The process of claim 2, wherein n=2 and $0.1 \leq x \leq 2.0$.

18. The process of claim 17, wherein the oxide superconductor comprises a sintered body having a critical temperature of 100 K. and about 80% of an entire volume of the sintered body of the oxide superconductor is in a superconducting state.

* * * * *